United States Patent
Wu et al.

(10) Patent No.: US 11,632,081 B1
(45) Date of Patent: Apr. 18, 2023

(54) TRANSMISSION LINE MODULE FOR ROTARY TRAVELING WAVE OSCILLATOR AND DESIGN METHOD THEREOF

(71) Applicant: THE CHINESE UNIVERSITY OF HONG KONG, SHENZHEN, Shenzhen (CN)

(72) Inventors: Liang Wu, Shenzhen (CN); Zehui Kang, Shenzhen (CN)

(73) Assignee: THE CHINESE UNIVERSITY OF HONG KONG, SHENZHEN, Shenzhen (CN)

(*) Notice: Subject to any disclaimer, the term of this patent is extended or adjusted under 35 U.S.C. 154(b) by 0 days.

(21) Appl. No.: 17/955,558

(22) Filed: Sep. 29, 2022

(30) Foreign Application Priority Data

Jul. 7, 2022 (CN) .......................... 202210792229.8

(51) Int. Cl.
 H01P 3/00 (2006.01)
 H03B 5/18 (2006.01)
 H01P 7/08 (2006.01)
 H03L 7/099 (2006.01)

(52) U.S. Cl.
 CPC ............. H03B 5/1852 (2013.01); H01P 7/08 (2013.01); H03L 7/0995 (2013.01)

(58) Field of Classification Search
 CPC .. H01P 3/00; H01P 3/003; H01P 3/006; H01P 3/02; H01P 3/023; H01P 3/026; H01P 7/08; H03B 5/1852
 See application file for complete search history.

(56) References Cited

U.S. PATENT DOCUMENTS

| | | | |
|---|---|---|---|
| 7,679,416 B2 * | 3/2010 | Cheng | H03K 5/15013 327/564 |
| 9,136,574 B2 * | 9/2015 | Kim | H01P 3/003 |
| 2004/0000959 A1 | 1/2004 | Howard et al. | |

OTHER PUBLICATIONS

K. Hettak, et al., 3D MMIC Compact Semi-Lumped Loaded CPW Stubs for Spurious Suppression Fabricated with a Standard Air Bridge Process, IEEE International Microwave Symposium, 2009, pp. 1033-1036.

* cited by examiner

*Primary Examiner* — Hai L Nguyen
(74) *Attorney, Agent, or Firm* — Bayramoglu Law Offices LLC (57) ABSTRACT

Provided are a transmission line module for a rotary traveling wave oscillator (RTWO) and a design method thereof. The transmission line module includes a substrate. The upper surface of the substrate is provided with a grounding metal layer, that is, a metal ground. The metal ground is provided with a rectangular groove. The rectangular groove penetrates front and rear sides of the metal ground along a length direction of the rectangular groove. The thickness of the rectangular groove is the same as the thickness of the metal ground. The rectangular groove is filled with a silicon dielectric plate that has the same shape and size as the rectangular groove. The upper surface of the silicon dielectric plate is provided with two parallel transmission lines along the length direction of the rectangular groove.

12 Claims, 5 Drawing Sheets

TRANSMISSION LINE MODULE FOR ROTARY TRAVELING WAVE OSCILLATOR AND DESIGN METHOD THEREOF

CROSS REFERENCE TO THE RELATED APPLICATIONS

This application is based upon and claims priority to Chinese Patent Application No. 202210792229.8, filed on Jul. 7, 2022, the entire contents of which are incorporated herein by reference.

TECHNICAL FIELD

The present disclosure relates to rotary traveling wave oscillators (RTWOs) and, in particular, to a transmission line module for an RTWO and a design method thereof.

BACKGROUND

The existing RTWO is generally used as a signal source for clock networks or used to provide multi-phase signals, but it has a figure of merit (FoM) much lower than the conventional inductor-capacitor (LC) oscillator. The FoM of the LC oscillator is currently 5 dB higher than that of the RTWO at the same frequency. This is mainly caused by two reasons as follows. First, the RTWO needs multiple inverter pairs to maintain the oscillation, and there is no suitable topology to reduce the phase noise introduced by the inverter pairs. Secondly, the transmission lines constituting the RTWO usually have a quality factor much lower than that of an inductor at the same frequency, which also increases the phase noise and eventually leads to a lower FoM of the RTWO.

SUMMARY

The purpose of the present disclosure is to overcome the deficiencies of the prior art and provide a transmission line module for an RTWO and a design method thereof. The transmission line module has a much-improved quality factor compared to the conventional structure and resolves the problem that the existing RTWO has a lower quality factor than that of the resonant cavity of the LC oscillator.

The purpose of the present disclosure is achieved by the following technical solutions: A transmission line module for an RTWO includes a substrate, where an upper surface of the substrate is provided with a grounding metal layer, that is, a metal ground.

The metal ground is provided with a rectangular groove, which penetrates front and rear sides of the metal ground along a length direction of the rectangular groove. The thickness of the rectangular groove is the same as the thickness of the metal ground. The rectangular groove is filled with a silicon dielectric plate that has the same shape and size as the rectangular groove. An upper surface of the silicon dielectric plate is provided with two parallel transmission lines along the length direction of the rectangular groove.

A design method of a transmission line module for an RTWO includes the following steps:

S1: determining a length $\lambda=u/f$ of one wavelength of an entire transmission line based on a frequency f required for the RTWO, where u is the wave propagation speed in the transmission line, and setting the total length of the transmission line to vary around the length $\lambda$ of one wavelength;

S2: assuming that the entire transmission line forms a Möbius strip and dividing the total length of the transmission line by a phase number K required for the RTWO to obtain transmission line modules each having a length $l=\lambda/K$;

S3: assuming the width of each transmission line in any of the transmission line modules as $W_T$, spacing between two transmission lines as $S_T$, and the width of a rectangular groove provided on the metal ground, that is, spacing between two metal grounds obtained after cutting the rectangular groove as $S_M$;

S4: initializing $S_M$ to zero, initializing the spacing $S_T$ between the transmission lines to $S_{T0}$, and initializing the width $W_T$ of the transmission line to $W_{T0}$, where $S_{T0}$ and $W_{T0}$ are preset initial parameters and respectively indicate a minimum value of the spacing between the transmission lines and the maximum value of the width of the transmission line;

setting a step $\Delta S_M$, keeping the spacing $S_T$ between the transmission lines at $S_{T0}$ and the width $W_T$ of the transmission line at $W_{T0}$, increasing $S_M$ from 0 by the step $\Delta S_M$ each time, performing electromagnetic field simulation on the transmission line module at different $S_M$ to obtain resistance-inductance-conductance-capacitance (RLGC) parameters of the transmission line module, and calculating a quality factor $Q_{lump}$ of the transmission line at different $S_M$; and selecting a value of $S_M$ as final spacing $S_M$ between the metal grounds when $S_M$ increases without a significant increase in the quality factor $Q_{lump}$ of the transmission line, where the significant increase means that an increased value of $Q_{lump}$ is smaller than a specified threshold;

S5: setting a step $\Delta S_T$, keeping the width $W_T$ of the transmission line at $W_{T0}$, and keeping the spacing $S_M$ between the metal grounds at the value obtained in step S4;

increasing $S_T$ from $S_{T0}$ by the step $\Delta S_T$ each time, performing electromagnetic field simulation on the transmission line module at different $S_T$ to obtain the RLGC parameters of the transmission line module, and calculating the quality factor $Q_{lump}$ of the transmission line at different $S_T$; and until $Q_{lump}$ deteriorates as $S_T$ increases, selecting $S_T$ corresponding to the highest $Q_{lump}$ as the final spacing between the transmission lines, where $Q_{lump}$ deteriorates means that $Q_{lump}$ becomes smaller; and S6: setting a step $\Delta W_T$, keeping the spacing $S_M$ between the metal grounds at the value obtained in step S4, and keeping the spacing $S_T$ between the transmission lines at the value obtained in step S5;

decreasing $W_T$ from $W_{T0}$ by the step $\Delta W_T$ each time, performing electromagnetic field simulation on the transmission line module at different $W_T$ to obtain the RLGC parameters of the transmission line module and calculating the quality factor $Q_{lump}$ of the transmission line at different $W_T$; and until $Q_{lump}$ deteriorates as $W_T$ decreases, selecting $W_T$ corresponding to the highest $Q_{lump}$ as the final width of the transmission line, where $Q_{lump}$ deteriorates means that $Q_{lump}$ becomes smaller.

The design method further includes step S7:

for each transmission line module in the Möbius strip, setting the width $W_T$ of the transmission line, the spacing $S_T$ between the transmission lines, and the spacing $S_M$ between the metal grounds to data obtained in steps S4 to S6.

The quality factor $Q_{lump}$ of the transmission line module is calculated as follows:

calculating a propagation constant of the transmission line:

$\gamma=\alpha+j\beta$, where

γ is the propagation constant of the transmission line, α is an attenuation constant of the transmission line, and β is a phase propagation constant of the transmission line;

representing the propagation constant γ of the transmission line by using the following formula and the RLGC parameters, where R indicates a resistance per unit length, L indicates an inductance per unit length, G indicates a conductance per unit length, and C indicates a capacitance per unit length:

$$\gamma = \sqrt{(R+j\omega L)(G+j\omega C)}$$

determining an input impedance $Z_{in}$ of the transmission line module:

$$Z_{in} = \sqrt{\frac{\omega^2 LC + j\omega(LG - CR)}{G^2 + \omega^2 C^2}} \frac{e^{4\alpha l} - 1 + j2e^{2\alpha l}\sin(2\beta l)}{e^{4\alpha l} + 2e^{2\alpha l}\cos(2\beta l) + 1}, \text{ where}$$

w=2πf, f is an operating frequency, and I is the length of the transmission line; and calculating the quality factor of the transmission line module by $$Q_{lump} = \frac{im(Z_{in})}{re(Z_{in})},$$

which is simplified as:

$$Q_{lump} = \frac{im(Z_{in})}{re(Z_{in})} = \frac{\beta}{\alpha} - \frac{\frac{\beta}{\alpha} + \frac{\alpha}{\beta}}{\frac{\alpha}{\beta}\sqrt{1+\xi^2} + \xi + 1}, \text{ where } \zeta = \frac{\omega}{R/L - G/C}.$$

The beneficial effect of the present disclosure is as follows: The transmission line module of the present disclosure has a much-improved quality factor compared to the conventional structure and resolves the problem that the existing RTWO has a lower quality factor than that of the resonant cavity of the LC oscillator.

Reference numerals: 1—substrate, 2—metal ground, 3—rectangular groove, and 4—transmission line.

DETAILED DESCRIPTION OF THE EMBODIMENTS

The technical solutions of the present disclosure are described in further detail below with reference to the accompanying drawings, but the protection scope of the present disclosure is not limited thereto.

Figure 1:
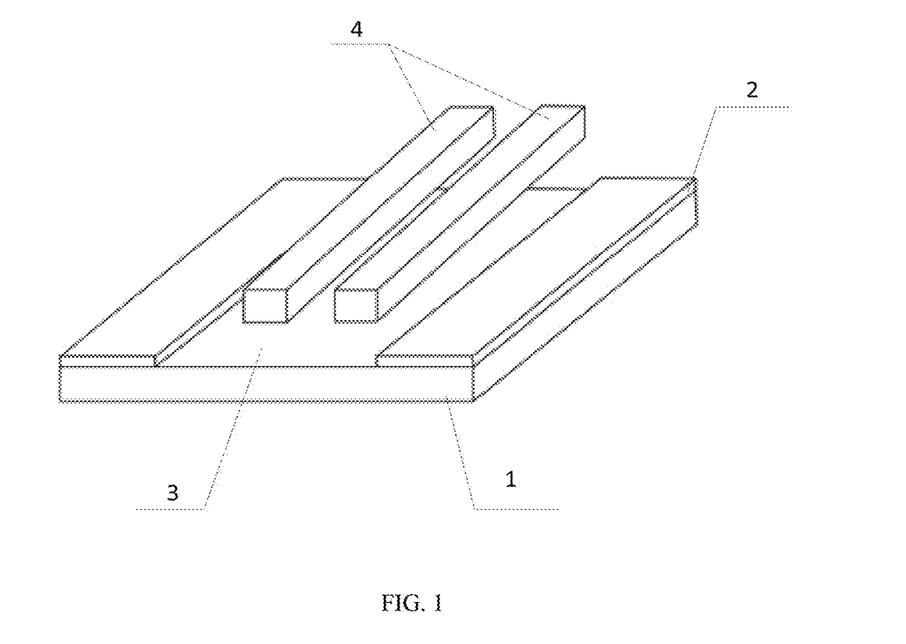
FIG. 1 is a schematic diagram of a structure of the present disclosure.

As shown in FIG. 1, a transmission line module for an RTWO includes the substrate 1, where an upper surface of the substrate 1 is provided with a grounding metal layer, that is, the metal ground 2.

The metal ground 2 is provided with the rectangular groove 3, which penetrates front and rear sides of the metal ground 2 along the length direction of the rectangular groove 3. The thickness of the rectangular groove 3 is the same as the thickness of the metal ground 2. The rectangular groove 3 is filled with a silicon dielectric plate that has the same shape and size as the rectangular groove 3. An upper surface of the silicon dielectric plate is provided with the two parallel transmission lines 4 along the length direction of the rectangular groove 3.

In this embodiment of the present application, the transmission lines 4 are rectangular transmission lines, and the width of either of the transmission lines 4 is smaller than one-half of the width of the rectangular groove 3.

A design method of a transmission line module for an RTWO includes the following steps:

S1: Determine the length λ=u/f of one wavelength of an entire transmission line based on a frequency f required for the RTWO, where u is the wave propagation speed in the transmission line, and set the total length of the transmission line to vary around the length λ of one wavelength.

The setting of the total length of the transmission line to vary around the length of one wavelength means that an absolute value of the difference between the length of the transmission line and λ does not exceed a specified threshold.

S2: Assume that the entire transmission line forms a Möbius strip and divide the total length of the transmission line by a phase number K required for the RTWO to obtain transmission line modules each having a length l=λ/K, where the phase number K is 8, 16, or 32.

S3: Assume the width of each transmission line in any of the transmission line modules as $W_T$, spacing between two transmission lines as $S_T$, and the width of a rectangular groove provided on a metal ground, that is, spacing between two metal grounds obtained after cutting the rectangular groove, as $S_M$.

S4: Initialize $S_M$ to zero, initialize the spacing $S_T$ between the transmission lines to $S_{T0}$, and initialize the width $W_T$ of the transmission line to $W_{T0}$, where $S_{T0}$ and $W_{T0}$ are preset initial parameters and respectively indicate the minimum value of the spacing between the transmission lines and the maximum value of the width of the transmission line;

set a step $\Delta S_M$, keep the spacing $S_T$ between the transmission lines at $S_{T0}$ and the width $W_T$ of the transmission line at $W_{T0}$, increase $S_M$ from 0 by the step $\Delta S_M$ each time, perform electromagnetic field simulation on the transmission line module at different $S_M$ to obtain resistance-inductance-conductance-capacitance (RLGC) parameters of the transmission line module, and calculate a quality factor $Q_{lump}$ of the transmission line at different $S_M$; and select a value of $S_M$ as the final spacing $S_M$ between the metal grounds when $S_M$ increases without a significant increase in the quality factor $Q_{lump}$ of the transmission line, where the significant increase means that an increased value of $Q_{lump}$ is smaller than a specified threshold.

S5: Set a step $\Delta S_T$, keep the width $W_T$ of the transmission line at $W_{T0}$, and keep the spacing $S_M$ between the metal grounds at the value obtained in step S4;

increase $S_T$ from $S_{T0}$ by the step $\Delta S_T$ each time, perform electromagnetic field simulation on the transmission line module at different $S_T$ to obtain the RLGC parameters of the transmission line module, and calculate the quality factor $Q_{lump}$ of the transmission line at different $S_T$; and until $Q_{lump}$ deteriorates as $S_T$ increases, select $S_T$ corresponding to the highest $Q_{lump}$ as the final spacing between the transmission lines, where $Q_{lump}$ deteriorates means that $Q_{lump}$ becomes smaller.

S6: Set a step $\Delta W_T$, keep the spacing $S_M$ between the metal grounds at the value obtained in step S4, and keep the spacing $S_T$ between the transmission lines at the value obtained in step S5;

decrease $W_T$ from $W_{T0}$ by the step $\Delta W_T$ each time, perform electromagnetic field simulation on the transmission line module at different $W_T$ to obtain the RLGC parameters of the transmission line module, and calculate the quality factor $Q_{lump}$ of the transmission line at different $W_T$; and until $Q_{lump}$ deteriorates as $W_T$ decreases, select $W_T$ corresponding to the highest $Q_{lump}$ as the final width of the transmission line, where $Q_{lump}$ deteriorates means that $Q_{lump}$ becomes smaller.

The design method further includes step S7:

For each transmission line module in the Möbius strip, set the width $W_T$ of the transmission line, the spacing $S_T$ between the transmission lines, and the spacing $S_M$ between the metal grounds according to the data obtained in steps S4 to S6.

The quality factor $Q_{lump}$ of the transmission line module is calculated as follows:

calculating a propagation constant of the transmission line:

$$\gamma = \alpha + j\beta$$

where $\gamma$ is the propagation constant of the transmission line, $\alpha$ is the attenuation constant of the transmission line, and $\beta$ is the phase propagation constant of the transmission line;

representing the propagation constant $\gamma$ of the transmission line by using the following formula and the RLGC parameters, where R indicates a resistance per unit length, L indicates an inductance per unit length, G indicates a conductance per unit length, and C indicates a capacitance per unit length:

$$\gamma = \sqrt{(R+j\omega L)(G+j\omega C)}$$

determining an input impedance $Z_{in}$ of the transmission line module:

$$Z_{in} = \sqrt{\frac{\omega^2 LC + j\omega(LG - CR)}{G^2 + \omega^2 C^2}} \cdot \frac{e^{4\alpha l} - 1 + j2e^{2\alpha l}\sin(2\beta l)}{e^{4\alpha l} + 2e^{2\alpha l}\cos(2\beta l) + 1}$$

where $\omega = 2\pi f$, f is an operating frequency, and l is the length of the transmission line; and calculating the quality factor of the transmission line module by $$Q_{lump} = \frac{im(Z_{in})}{re(Z_{in})},$$

which is simplified as:

$$Q_{lump} = \frac{im(Z_{in})}{re(Z_{in})} = \frac{\beta}{\alpha} - \frac{\frac{\beta}{\alpha} + \frac{\alpha}{\beta}}{\frac{\alpha}{\beta}\sqrt{1+\xi^2} + \xi + 1}, \text{ where } \xi = \frac{\omega}{R/L - G/C}.$$

Figure 2:
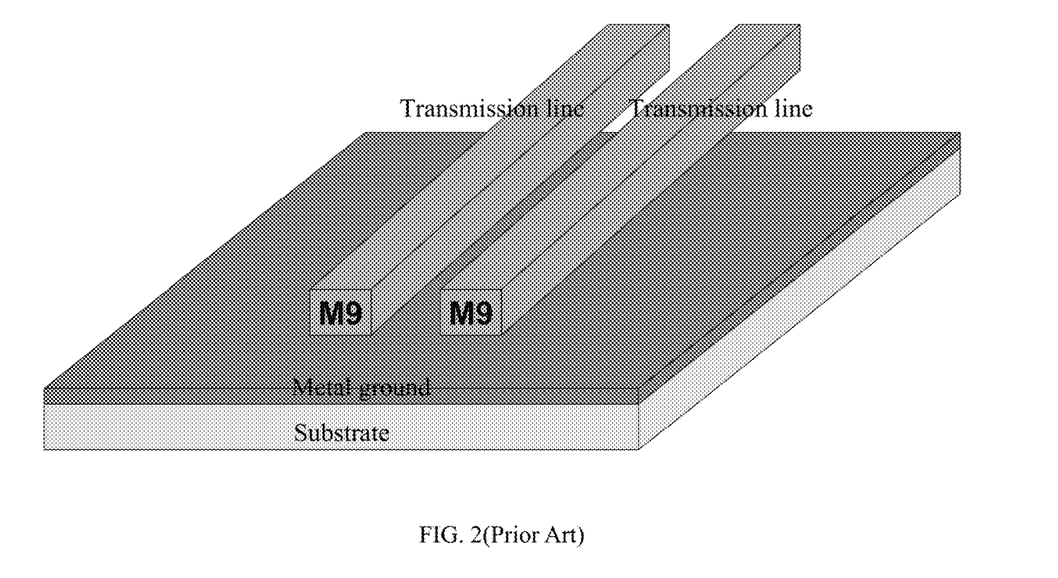
FIG. 2 is a schematic diagram of a structure of a conventional transmission line module.

FIG. 2 is a schematic diagram of a principle of a conventional transmission line module. As can be seen, compared with the conventional transmission line module, the present application removes metal directly below and on two sides of the transmission line, such that the parasitic capacitance between the transmission line and the ground is smaller. With 8 um-wide transmission lines, RLGC parameters of the conventional transmission line module obtained through electromagnetic simulation are R=4650 Ω/m, L=270 nH/m, G=0.25 S/m, and C=150 pF/m, while RLGC parameters of the present application are R=5000 Ω/m, L=476 nH/m, G=0.75 S/m, and C=90 pF/m. It indicates that compared with the conventional structure, the transmission line used in this design significantly increases the values of L and G and decreases the value of C, such that a difference between R/L and G/C is smaller, thereby obtaining a transmission line module with a higher quality factor in the lumped model.

Figure 3:
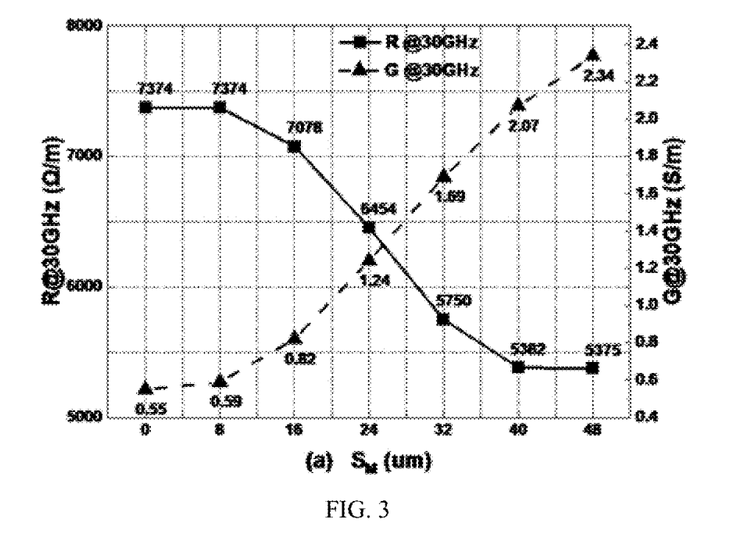
FIG. 3 is a simulation graph showing a relationship among parameters R, G, and $S_M$ according to an embodiment.
Figure 4:
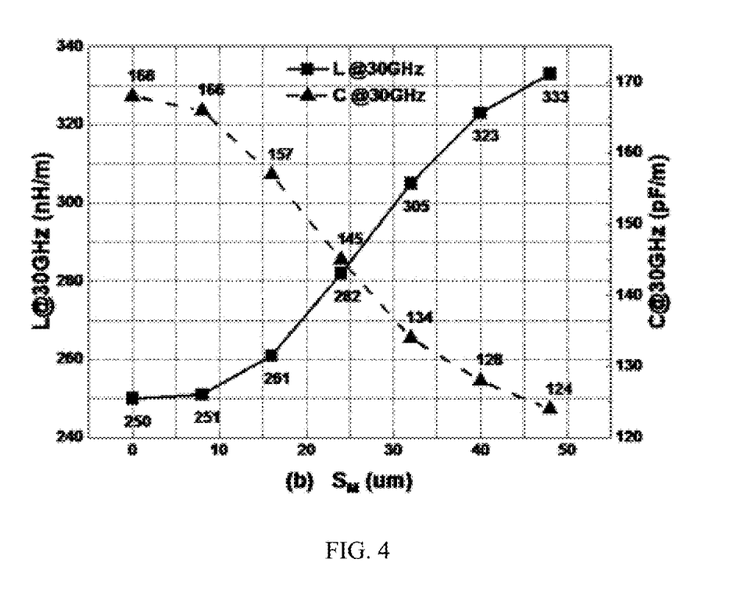
FIG. 4 is a simulation graph showing a relationship among parameters L, C, and $S_M$ according to an embodiment.
Figure 5:
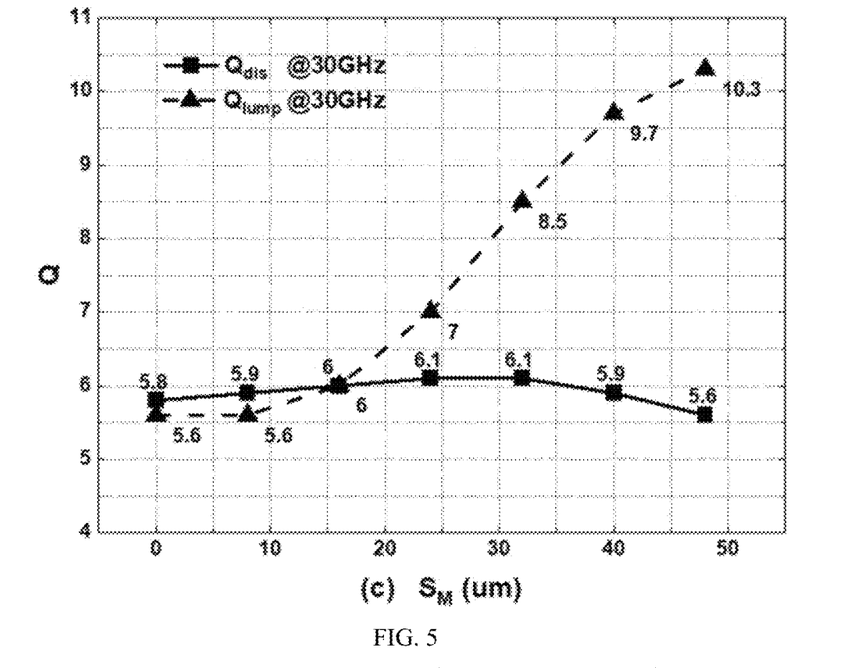
FIG. 5 is a simulation graph showing a relationship among parameters $Q_{dis}$, $Q_{lump}$, and $S_M$ under simulation according to an embodiment.
Figure 6:
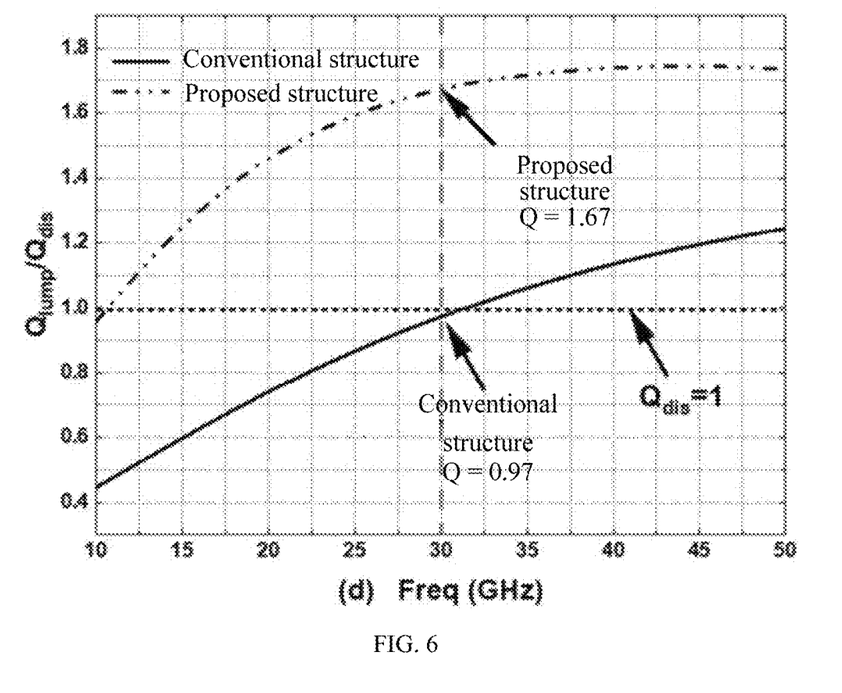
FIG. 6 is a simulation graph showing a relationship between a frequency and normalized quality factors of a conventional transmission line and a 140 um differential transmission line according to an embodiment.
Figure 7A:
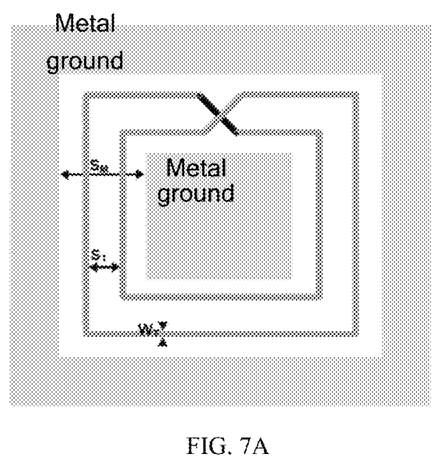
FIGS. 7A-7D are four schematic diagrams showing connection modes of the transmission lines consisting of Möbius strips according to an embodiment.
Figure 7B:
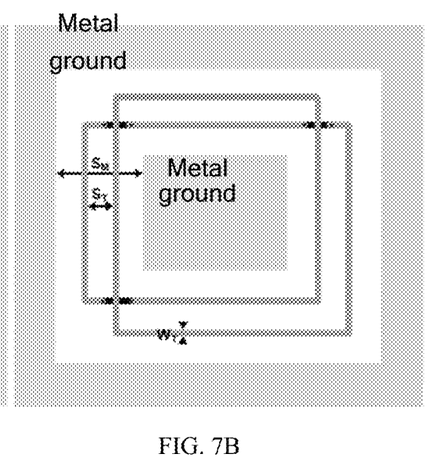
Figure 7C:
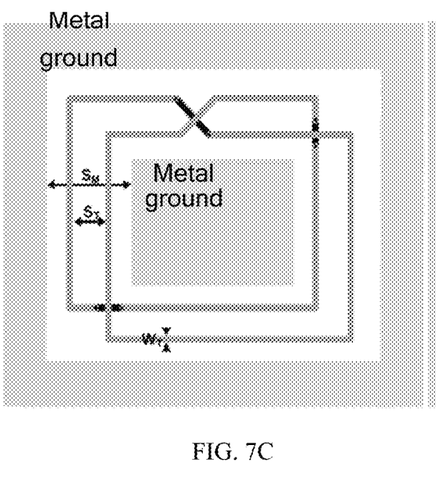
Figure 7D:
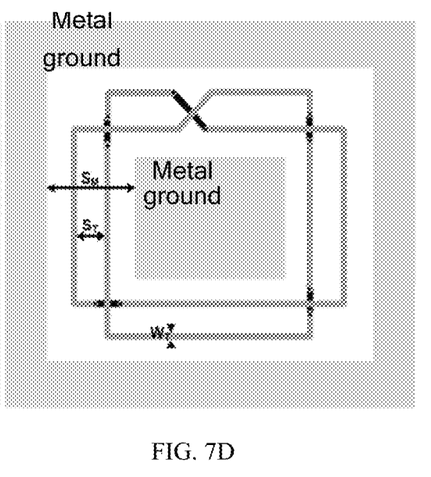

In addition, in the present application, the RLGC parameters of the transmission line can be adjusted by changing the spacing $S_M$ between the two transmission lines. In an embodiment of the present application, the simulation results are shown in FIG. 3 to FIG. 6. FIG. 3 and FIG. 4 show that when the spacing $S_M$ between the differential transmission lines increases, G and L also increase and C decreases, thereby achieving a higher quality factor of the transmission line. For example, the differential transmission line is 140 um long and 8 um wide. FIG. 5 shows that when the spacing $S_M$ is changed, $Q_{dis}$ changes less, but the quality factor $Q_{lump}$ in the lumped model can be significantly optimized. As shown in FIG. 6, at 30 GHz, the optimized quality factor $Q_{lump}$ of the transmission line can reach 1.67 times of the conventional structure.

As shown in FIGS. 7A-7D, in an embodiment of the present application, a Möbius strip can be formed with the transmission line by using any of the four structures (a) to (d), where the adjacent parallel differential transmission lines on each side of the Möbius strip should satisfy the values of $W_T$, $S_T$, and $S_M$. The corners of the Möbius strip may alternatively be obtuse angles of 135 degrees, rather than right angles. The metal ground inside the Möbius strip may or may not be connected to the external metal ground, and the metal ground inside the Möbius strip may alternatively be removed after the design of the Möbius strip and the metal ground is completed.

Figure 8:
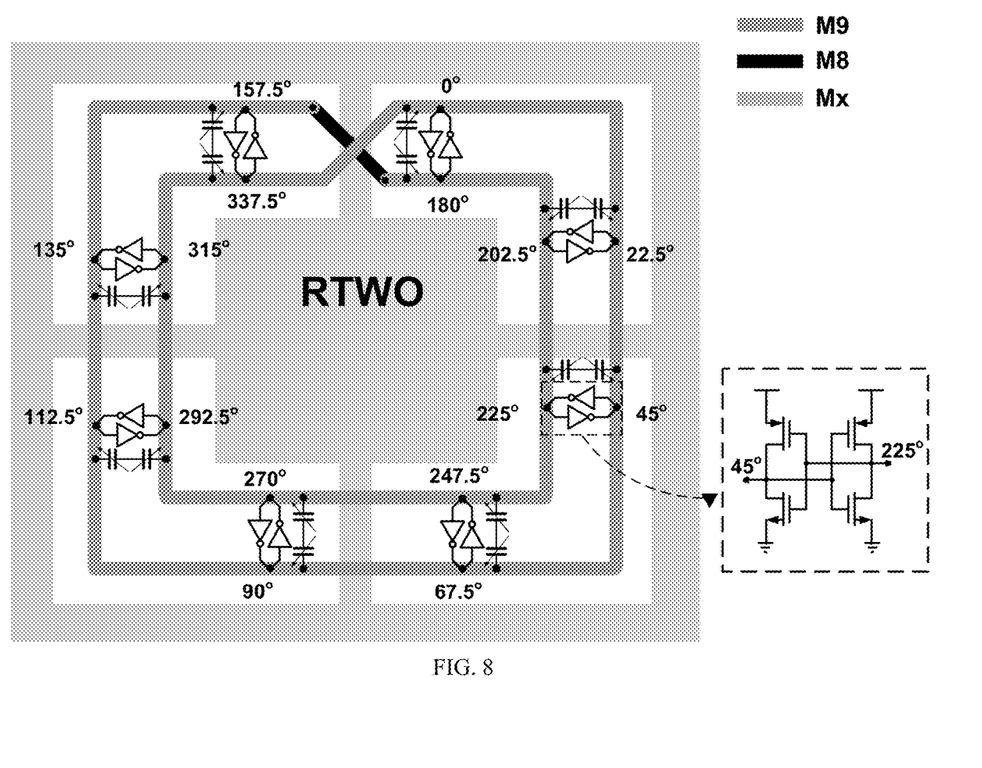
FIG. 8 is a circuit structural diagram of an RTWO designed according to the present application.

In an embodiment of the present application, inverters may be connected to the Möbius strip to form an RTWO. FIG. 8 is a structural diagram of the RTWO designed according to this embodiment. The oscillator uses a total of eight pairs of inverters and can output 16 different phases. The transmission line module of the present disclosure removes the metal under the transmission line to achieve a higher quality factor of the transmission line, thereby lowering the oscillator phase noise. The RTWO can operate between 24.34 GHz and 27.54 GHz with a tuning range of 12.3%. When the RTWO is tuned to 27.54 GHz, the measured phase noise is −124.54 dBc/Hz, corresponding to a FOM of 186.7 dBc/Hz. The chip has a power consumption of 4.6 mW and a supply voltage of 0.74 V, showing advantages in low-power applications. Tests show that the chip can still operate at a power consumption of 2.7 mW and maintain an optimal FoM of 184.6 dBc/Hz @10 MHz.

Table 1 summarizes the performance parameters of recent RTWOs and multi-phase LC oscillators and shows by comparison that the RTWO formed by the transmission line in the present application consumes the least power while has a leading FoM among multi-phase oscillators in the millimeter wave band. When using the same CMOS 65 nm process, the design can improve the FoM by more than 3 dB compared with the conventional RTWO and has performance comparable to the design implemented by the more advanced 22 nm FDI-SOI process. Due to the optimized quality factor Q of the transmission line, the design achieves the highest $FoM_P$ of 198.7 dBc/Hz.

|  | The design of the present disclosure | JSSC'18 | JSSC'14 | JSSC'18 | JSSC'15 | JSSC'11 | JSSC'21 |
| --- | --- | --- | --- | --- | --- | --- | --- |
| Topology | RTWO | RTWO | RTWO | Multi-phase VCO | Multi-phase VCO | Multi-phase VCO | RTWO |
| Process | 65 nm | 28 nm | 65 nm | 65 nm | 40 nm LP | 40 nm LP | 22 nm FDI-SOI |
| Frequency (GHz) | 24.3-27.5 | 16.1-19.8 | 51.9-56.5 | 74.8-79 | 21.4-25.1 | 48.6-52 | 21.4-25.1 |
| Tuning range | 12.3% | 20.6% | 8.5% | 5.5% | 15.9% | 6.8% | 13.5% |
| Supply voltage (V) | 0.74 | 1.3 | 1.2 | 1 | 1 | 0.8 | 0.8 |
| Power consumption (mW) | 4.6 | 75 | 36 | 13 | 23 | 35 | 21 |
| Phase noise (dBc/Hz) @ 10 MHz | −124.5 | −132.8 | −125 | −116.5 | −119 | −127.8 | −128.9 |
| FoM (dBc/Hz) @ 10 MHz | 186.7 | 179.5 | 183.7 | 183 | 172 | 186.4 | 185.4 |
| Phase number | 16 | 16 | 4 | 8 | 8 | 8 | 16 |
| $FoM_T$ (dBc/Hz) | 188.5 | 185.7 | 182.3 | 177.8 | 176 | 183 | 188.1 |
| $FoM_P$ (dBc/Hz) | 198.7 | 191.5 | 189.7 | 192 | 181 | 195.4 | 197.5 |
| Core area (mm²) | 0.12 | 0.38 | 0.1 | 0.3 | 0.063 | 0.09 | 0.24 |

FoM=|phase noise|+20 $\log_{10}$(operating frequency/offset frequency)−10 $\log_{10}$(power consumption/1 mW), $FoM_T$=FoM+20 $\log_{10}$(tuning range/10%), and $FoM_P$=FoM+10 $\log_{10}$(phase number).

The above explanation shows and describes several preferred embodiments of the present disclosure. But as mentioned above, it should be understood that the present disclosure is not limited to the form disclosed herein, and the explanation should not be regarded as an exclusion of other embodiments. Various combinations and modifications can be achieved through the above guides and technologies or knowledge in related fields within the scope of the concept of the present disclosure described herein. Modifications and changes made by those skilled in the art without departing from the spirit and scope of the present disclosure should fall within the protection scope of the appended claims of the present disclosure.

What is claimed is:

1. A design method of a transmission line module for a rotary traveling wave oscillator (RTWO), wherein the design method the following steps:

S1: determining a length $\lambda=u/f$ of one wavelength of a transmission line based on a frequency f required for the RTWO, wherein u is a wave propagation speed in the transmission line; and setting a total length of the transmission line to vary around the length $\lambda$ of one wavelength;

S2: assuming that the transmission line forms a Möbius strip, and dividing the total length of the transmission line by a phase number K required for the RTWO, to obtain transmission line modules each having a length $l=\lambda/K$;

S3: assuming a width of each transmission line in any of the transmission line modules as $W_T$, spacing between two transmission lines as $S_T$, and spacing between two metal grounds obtained after cutting the rectangular groove as $S_M$, wherein each transmission line module comprises two parallel transmission lines, and $S_M$ is a width of the rectangular groove provided on the metal ground;

S4: initializing $S_M$ to zero, initializing the spacing $S_T$ between the transmission lines to $S_{T0}$, and initializing the width $W_T$ of the transmission line to $W_{T0}$, wherein $S_{T0}$ and $W_{T0}$ are preset initial parameters and respectively indicate a minimum value of the spacing between the transmission lines and a maximum value of the width of the transmission line;

setting a step $\Delta S_M$, keeping the spacing $S_T$ between the transmission lines at $S_{T0}$ and the width $W_T$ of the transmission line to $W_{T0}$, increasing $S_M$ from 0 by the step $\Delta S_M$ each time, performing electromagnetic field simulation on the transmission line module at different $S_M$, to obtain resistance-inductance-conductance-capacitance (RLGC) parameters of the transmission line module, and calculating a quality factor $Q_{lump}$ of the transmission line at the different $S_M$; and selecting a value of $S_M$ as final spacing between the metal grounds when $S_M$ increases without a significant increase in the quality factor $Q_{lump}$ of the transmission line, wherein the significant increase indicates that an increased value of $Q_{lump}$ is smaller than a preset threshold;

S5: setting a step $\Delta S_T$, keeping the width $W_T$ of the transmission line at $W_{T0}$, and keeping the spacing $S_M$ between the metal grounds at the value obtained in step S4;

increasing $S_T$ from $S_{T0}$ by the step $\Delta S_T$ each time, performing the electromagnetic field simulation on the transmission line module at different $S_T$, to obtain the RLGC parameters of the transmission line module, and calculating the quality factor $Q_{lump}$ of the transmission line at the different $S_T$; and until $Q_{lump}$ deteriorates as $S_T$ increases, selecting a value of $S_T$ corresponding to the highest $Q_{lump}$ as the final spacing between the transmission lines, wherein $Q_{lump}$ deteriorating means that $Q_{lump}$ becomes smaller; and S6: setting a step $\Delta W_T$, keeping the spacing $S_M$ between the metal grounds at the value obtained in step S4, and keeping the spacing $S_T$ between the transmission lines at the value obtained in step S5;

decreasing $W_T$ from $W_{T0}$ by the step $\Delta W_T$ each time, performing the electromagnetic field simulation on the transmission line module at different $W_T$, to obtain the RLGC parameters of the transmission line module, and calculating the quality factor $Q_{lump}$ of the transmission line at the different $W_T$; and until $Q_{lump}$ deteriorates as $W_T$ decreases, selecting $W_T$ corresponding to the highest $Q_{lump}$ as the final width of the transmission line, wherein $Q_{lump}$ deteriorating means that $Q_{lump}$ becomes smaller.

2. The design method according to claim 1, wherein the design method further comprises step S7:

for each transmission line module in the Möbius strip, setting the width $W_T$ of the transmission line, the spacing $S_T$ between the transmission lines, and the spacing $S_M$ between the metal grounds according to data obtained in steps S4 to S6.

3. The design method according to claim 1, wherein the step of setting the total length of the transmission line to vary around the length of one wavelength comprises: keeping an absolute value of a difference between the total length of the transmission line and $\lambda$ within a preset threshold.

4. The design method according to claim 1, wherein the phase number K is 8, 16, or 32.

5. The design method according to claim 1, wherein the quality factor $Q_{lump}$ of the transmission line is calculated as follows:

calculating a propagation constant of the transmission line:

$\gamma=\alpha+j\beta$, wherein $\gamma$ is the propagation constant of the transmission line, $\alpha$ is an attenuation constant of the transmission line, and $\beta$ is a phase propagation constant of the transmission line;

representing the propagation constant $\gamma$ of the transmission line by using the following formula and the RLGC parameters:

$\gamma=\sqrt{(R+j\omega L)(G+j\omega C)}$, wherein R indicates a resistance per unit length, L indicates an inductance per unit length, G indicates a conductance per unit length, and C indicates a capacitance per unit length;

determining an input impedance $Z_{in}$ of the transmission line module:

$$Z_{in} = \sqrt{\frac{\omega^2 LC + j\omega(LG - CR)}{G^2 + \omega^2 C^2}} \frac{e^{4\alpha l} - 1 + 2e^{2\alpha l}\sin(2\beta l)}{e^{4\alpha l} + 2e^{2\alpha l}\cos(2\beta l) + 1},$$

wherein $\omega=2\pi f$, f is an operating frequency, and l is the total length of the transmission line; and calculating the quality factor of the transmission line by the following formula:

$$Q_{lump} = \frac{im(Z_{in})}{re(Z_{in})},$$

simplified as:

$$Q_{lump}\frac{im(Z_{in})}{re(Z_{in})} = \frac{\beta}{\alpha} - \frac{\frac{\beta}{\alpha} + \frac{\alpha}{\beta}}{\frac{\alpha}{\beta}\sqrt{1+\xi^2} + \xi + 1},$$

wherein $$\xi = \frac{\omega}{R/L - G/C}.$$

6. A transmission line module for a rotary traveling wave oscillator (RTWO) using the design method according to claim 1, comprising a substrate, wherein an upper surface of the substrate is provided with a grounding metal layer, and the grounding metal layer is a metal ground; and the metal ground is provided with a rectangular groove, the rectangular groove penetrates front and rear sides of the metal ground along a length direction of the rectangular groove, a thickness of the rectangular groove is the same as a thickness of the metal ground, the rectangular groove is filled with a silicon dielectric plate, the silicon dielectric plate has a same shape and size as the rectangular groove, and an upper surface of the silicon dielectric plate is provided with two parallel transmission lines along the length direction of the rectangular groove.

7. The transmission line module according to claim 6, wherein the two parallel transmission lines are rectangular transmission lines.

8. The transmission line module according to claim 6, wherein a width of each of the two parallel transmission lines is shorter than one-half of a width of the rectangular groove.

9. The transmission line module according to claim 6, wherein the design method further comprises step S7:

for each transmission line module in the Möbius strip, setting the width $W_T$ of the transmission line, the spacing $S_T$ between the transmission lines, and the spacing $S_M$ between the metal grounds according to data obtained in steps S4 to S6.

10. The transmission line module according to claim 6, wherein in the design method, the step of setting the total length of the transmission line to vary around the length of one wavelength comprises: keeping an absolute value of a difference between the total length of the transmission line and $\lambda$ within a preset threshold.

11. The transmission line module according to claim 6, in the design method, wherein the phase number K is 8, 16, or 32.

12. The transmission line module according to claim 6, in the design method, wherein the quality factor $Q_{lump}$ of the transmission line is calculated as follows:

calculating a propagation constant of the transmission line:

$\gamma=\alpha+j\beta$, wherein $\gamma$ is the propagation constant of the transmission line, $\alpha$ is an attenuation constant of the transmission line, and $\beta$ is a phase propagation constant of the transmission line;

representing the propagation constant γ of the transmission line by using the following formula and the RLGC parameters:

$$\gamma=\sqrt{(R+j\omega L)(G+j\omega C)},$$

wherein R indicates a resistance per unit length, L indicates an inductance per unit length, G indicates a conductance per unit length, and C indicates a capacitance per unit length;

determining an input impedance $Z_{in}$ of the transmission line module:

$$Z_{in} = \sqrt{\frac{\omega^2 LC + j\omega(LG-CR)}{G^2 + \omega^2 C^2}} \frac{e^{4\alpha l}-1+2e^{2\alpha l}\sin(2\beta l)}{e^{4\alpha l}+2e^{2\alpha l}\cos(2\beta l)+1},$$

wherein $w=2\pi f$, f is an operating frequency, and l is the total length of the transmission line; and calculating the quality factor of the transmission line by the following formula:

$$Q_{lump} = \frac{im(Z_{in})}{re(Z_{in})},$$

simplified as:

$$Q_{lump} = \frac{im(Z_{in})}{re(Z_{in})} = \frac{\beta}{\alpha} - \frac{\frac{\beta}{\alpha}+\frac{\alpha}{\beta}}{\frac{\alpha}{\beta}\sqrt{1+\xi^2}+\xi+1},$$

wherein $$\xi = \frac{\omega}{R/L - G/C}.$$

* * * * *